United States Patent [19]

Wilson et al.

[11] Patent Number: 5,287,555
[45] Date of Patent: * Feb. 15, 1994

[54] POWER CONTROL CIRCUITRY FOR A TDMA RADIO FREQUENCY TRANSMITTER

[75] Inventors: Gregory P. Wilson, Lake Zurich; Donald B. Lemersal, Jr., Park Ridge; Rashid M. Osmani, Carol Stream; Dale G. Schwent, Hoffman Estates; John C. Johnson, Palatine, all of Ill.

[73] Assignee: Motorola, Inc., Schaumburg, Ill.

[*] Notice: The portion of the term of this patent subsequent to Mar. 9, 2000 has been disclaimed.

[21] Appl. No.: 733,797

[22] Filed: Jul. 22, 1991

[51] Int. Cl.$^5$ .......................... H03G 3/20; H04B 1/04
[52] U.S. Cl. .................... 455/115; 455/126; 455/127; 330/278
[58] Field of Search ............... 455/115, 116, 117, 126, 455/127, 89; 330/278, 279, 284, 291

[56] References Cited

U.S. PATENT DOCUMENTS

| | | | |
|---|---|---|---|
| 4,523,155 | 6/1985 | Walczak | 330/279 |
| 4,602,218 | 7/1986 | Vilmur | 330/279 |
| 4,727,337 | 2/1988 | Jason | 330/298 |
| 4,803,440 | 2/1989 | Hotta | 330/145 |
| 5,081,713 | 1/1992 | Miyazaki | 455/115 X |
| 5,095,542 | 3/1992 | Suematsu et al. | 455/427 |
| 5,150,075 | 9/1992 | Hietala et al. | 455/126 X |
| 5,193,223 | 3/1993 | Walczak et al. | 455/115 |

Primary Examiner—Reinhard J. Eisenzopf
Assistant Examiner—Chi H. Pham
Attorney, Agent, or Firm—John J. King; Rolland R. Hackbart

[57] ABSTRACT

A transmitter (604) of a TDMA cellular telephone (600) includes power control circuitry (100) comprised of variable gain stage (104), mixer (106), bandpass filter (109), RF amplifier (110), and directional coupler (112) in a forward path, and two detectors (116 and 117), four A/D converters (118, 119, 121 and 123), digital controller (120), and D/A converter (126) in a feedback path. In operation, the variable gain stage (104) is responsive to a gain control signal AOCCNT (128) for adjusting a modulated IF signal, which is then mixed in mixer (106) with an RF reference signal to produce the transmit RF signal. The temperature and supply voltage are sampled by controller (120) at the beginning of each time slot. Adjustments in the gain control signal (128) dictated by the sampled temperature and supply voltage are made by controller (120) in each time slot prior to keying the RF amplifier (110). The transmit RF signal is amplified by the RF amplifier (110) to produce the transmit output signal which is coupled by the directional coupler (112) and transmit filter (618) to an antenna (620) for transmission. The forward power and reverse power of the transmit output signal are sampled by controller (120) at the end of each time slot. The sampled forward power is used by controller (120) in calculating the value of the gain control signal for the next time slot. If the sampled reverse power or supply voltage exceed respective maximum values, the RF amplifier (110) is dekeyed by controller (120).

24 Claims, 6 Drawing Sheets

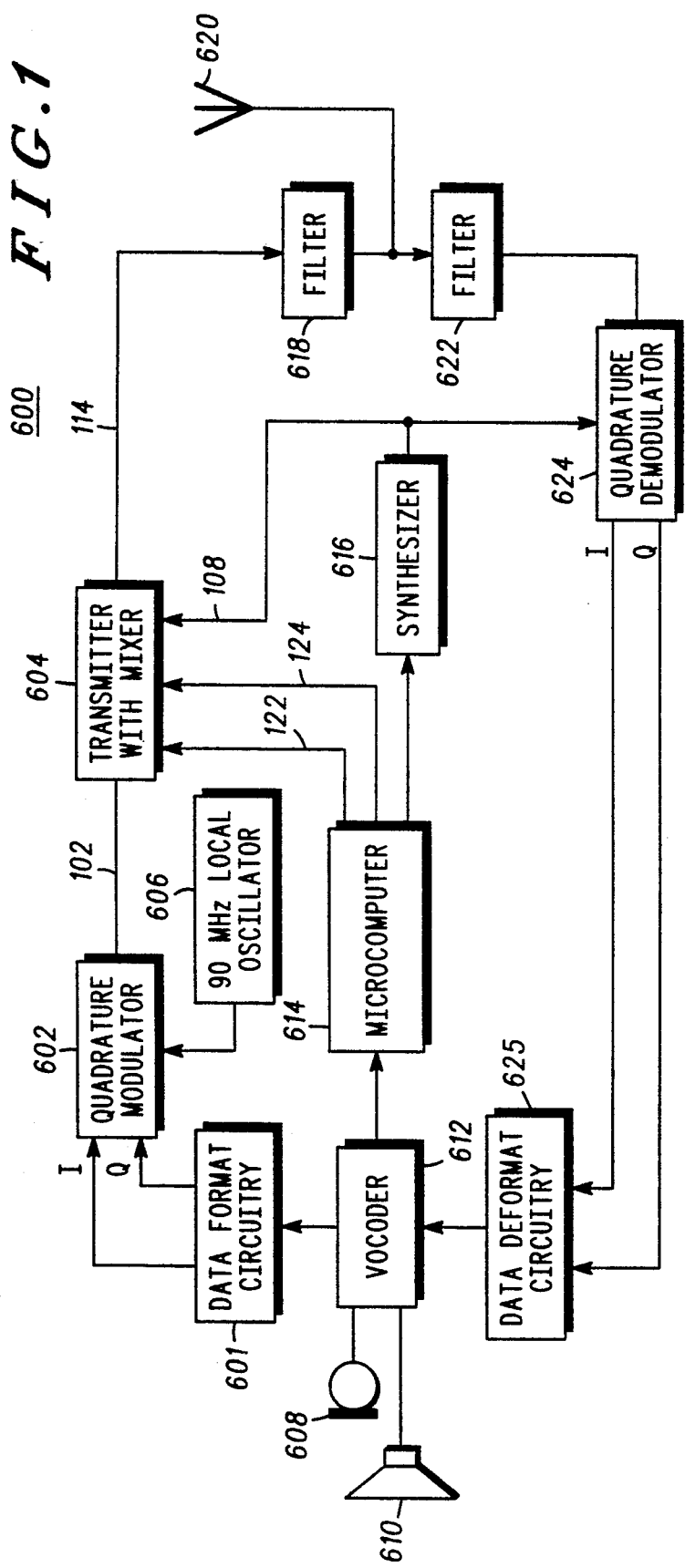
FIG.1
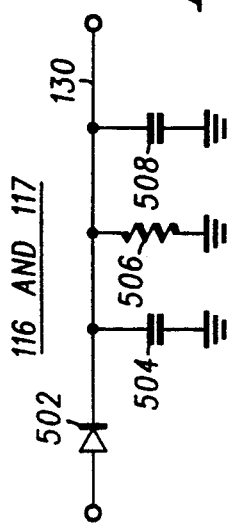
FIG.5
FIG.4

300

POWER CONTROL CIRCUITRY FOR A TDMA RADIO FREQUENCY TRANSMITTER

RELATED APPLICATIONS

This application is related to the instant assignee's copending application, Ser. No. 07/632,231, filed Dec. 20, 1990, invented by Thomas J. Walczak and Stephen V. Cahill, and entitled "Power Control Circuitry for a TDMA Radio Frequency Transmitter".

BACKGROUND OF THE INVENTION

The present invention is generally related to radiotelephones, and more particularly to a power control circuitry for a radio frequency (RF) transmitter operating in a continuous mode or a time-division multiple-access (TDMA) mode, that may be advantageously used in dual-mode digital/analog cellular telephones.

Analog cellular telephones currently are continuously transmitting during a telephone call. RF transmitters of such analog cellular telephones are frequency modulated with voice signals and continuously operated at one of eight different power levels depending the quality of the RF signal received therefrom by the cellular system base station. The output power of such RF transmitters are maintained at the desired power level by conventional automatic output power control circuitry, such as, for example, the circuitry shown and described in U.S. Pat. No. 4,523,155.

However, such conventional output power control circuitry is inadequate for TDMA cellular systems where it is necessary to rapidly pulse the RF transmitter on for 6.67 milliseconds and off 13.33 milliseconds every 20 milliseconds. Furthermore, it is also necessary that the RF transmitter output follow the envelope of the modulation, which has frequency components in excess of 12.15 KHz. These problems may be solved in part by output power control circuitry employing variable attenuators which attenuate the RF input to the transmitter power amplifier. An example of such output power control circuitry employing a variable attenuator is shown and described in U.S. Pat. No. 4,803,440. However, when such output power control circuitry is operated with a linear power amplifier at cellular transmitter frequencies ranging from 824 MHz to 849 MHz, output power can not be accurately maintained initially and dynamically due to resulting performance degradations, such as power amplifier saturation caused by temperature or supply voltage variations, inaccurate initial power levels caused by temperature, and incorrect power levels caused by antenna loading variations. For the foregoing reasons, there is a need for improved power control circuitry for precisely maintaining initially and dynamically the RF output signal from a TDMA RF signal transmitter at one of a plurality of power levels selected by the level control signals over temperature variations, supply voltage variations, and antenna loading variations.

SUMMARY OF THE INVENTION

Briefly stated, the present invention encompasses novel power control circuitry responsive to a transmit signal, level control signals, a timing signal defining a series of transmit time intervals, and a supply voltage from a signal source for maintaining during the transmit time intervals the average magnitude of a radio frequency (RF) output signal at a power level selected from a plurality of power levels by the level control signals. The power control circuitry comprises: memory circuitry for storing the value of a gain control signal; adjusting circuitry having variable gain for adjusting the transmit signal during the transmit time intervals substantially in proportion to the the stored value of the gain control signal to produce an adjusted transmit signal; amplifying circuitry coupled to the supply voltage for amplifying the transmit signal to produce the RF output signal; antenna circuitry coupled to the amplifying means for transmitting the RF output signal; voltage detecting circuitry for detecting the magnitude of the supply voltage; temperature detecting circuitry for detecting the temperature of the power control circuitry; power detecting circuitry coupled to the RF output signal for generating an output signal having a value related to the magnitude of the forward power of the RF output signal; and control circuitry coupled to the power detecting circuitry for sampling the value of the output signal substantially at the end of each transmit time interval, adjusting the value of the gain control signal in response to the difference between the sampled value of the output signal and the selected power level, and storing the adjusted value of the gain control signal in the memory means, said control circuitry further being coupled to the temperature detecting circuitry for adjusting the gain control signal by a first predetermined amount substantially at the beginning of each transmit time interval when the detected temperature is greater than a predetermined temperature, and said control circuitry further being coupled to the voltage detecting circuitry for adjusting the gain control signal by a second predetermined amount substantially at the beginning of at least the initial transmit time interval when the detected magnitude of the supply voltage is less than a predetermined magnitude.

BRIEF DESCRIPTION OF THE DRAWINGS

FIG. 1 is a block diagram of a TDMA cellular telephone, which may advantageously utilize the power control circuitry of the present invention, as embodied preferably in FIG. 2.

FIG. 4 is a circuit diagram of long time constant detectors 116 and 117 in FIG. 2.

FIG. 5 is a circuit diagram of directional coupler 112 in FIG. 2.

DESCRIPTION OF THE PREFERRED EMBODIMENT

Figure 2:
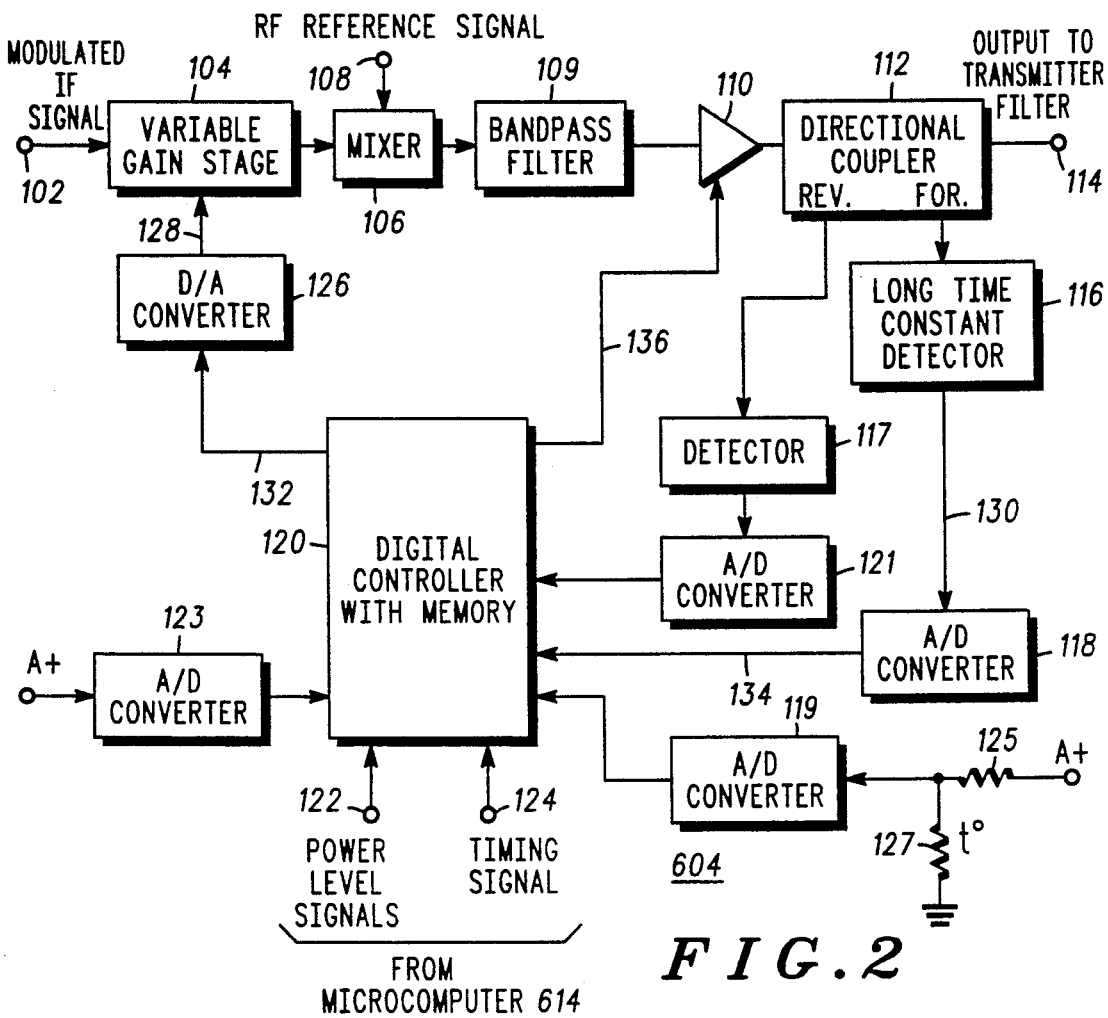
FIG. 2 is a block diagram of power control circuitry for an RF transmitter of TDMA cellular telephone 600 in FIG. 1, embodying the present invention.

Referring to FIG. 1, there is illustrated a block diagram of a TDMA cellular telephone 600 suitable for use in dual-mode TDMA/FDMA cellular telephones, which may advantageously utilize the power control circuitry of the present invention, as embodied preferably in FIG. 2. Telephone 600 includes, in its transmit signal path, microphone 608, vocoder 612, data format circuitry 601, quadrature modulator 602, 90 MHz local oscillator 606, transmitter with mixer 604, transmitter filter 618, and antenna 620. In its receive signal path, telephone 600 includes antenna 620, receiver filter 622, quadrature demodulator 624, data deformat circuitry 625, vocoder 612, and speaker 610. The channel frequency of telephone 600 is loaded into synthesizer 616 by microcomputer 614 and applied to transmitter 604 and demodulator 624. In the preferred embodiment, the duplex radio channels have transmit frequencies in the range from 824 MHz to 849 MHz and receive frequencies in the range from 869 MHz to 894 MHz. Telephone 600 is controlled by microcomputer 614 which includes a memory with a control and signaling computer program stored therein. In the preferred embodiment of telephone 600, microcomputer 614 is implemented with commercially available microcomputers, such as, for example, the Motorola type 68HC11 microcomputer. Although cellular telephone 600 utilizes TDMA RF channels, the present invention may also be utilized in conventional frequency division multiple access cellular telephones, in code division multiple access cellular telephones, and in other analog and digital cellular telephones employing different transmission schemes.

In the preferred embodiment of telephone 600 in FIG. 1, quadrature modulator 602 may be implemented as described in the instant assignee's U.S. Pat. No. 5,020,076, entitled "Hybrid Modulation Apparatus", invented by Stephen V. Cahill et al., and granted May 28, 1991 (incorporated herein by reference). Quadrature modulator 602 modulates TDMA RF signals with voice, data and signalling information according to $\pi/4$-shift differential quadrature phase shift keying (DQPSK). DQPSK modulation is described in "Digital Communications", by John G. Proakis, 1st Ed., ISBN 0-07-050927-1, at pages 171-178. Data format circuitry 601 combines the output of vocoder 612 with signalling and overhead information and encodes the result according to $\pi/4$-shift DQPSK modulation into the transmit I and Q signals. The $\pi/4$-shift DQPSK modulation and signalling information is specified in Interim Standard 54 published by and available from the Electronic Industries Association, Engineering Department, 2001 Eye Street N.W., Washington, D.C. 20006.

The signal vector representing the $\pi/4$-shift DQPSK modulation consists of a cosine component and a sine component. The signal scaling the amplitude of the cosine component is also known as the in-phase or I signal and the signal scaling the amplitude of the sine component is also known as the quadrature or Q signal. The I and Q scaled cosine and sine signals are the orthogonal quadrature components at the frequency of the 90 MHz signal from local oscillator 606; the modulated transmit IF signal 102 then being created by adding the I and Q signals.

Symbols representing the vector components of the I and Q signals are generated in data format circuitry 601 by shifting the vector components such that phase shifts of IF signal 102 of $\pm\pi/4$ or $\pm 3\pi/4$ radians are generated. Each phase shift encodes one of four possible symbols.

Serial digital data from vocoder 612 that is eventually to be modulated by modulator 602 is first converted to bit pairs in data format circuitry 601. Each bit pair specifies a symbol that is the desired vector shift relative to the previously transmitted symbol. The mapping of bit pairs to symbol vectors is according to the equations:

$$I(k) = I(k-1) \cos(\Delta\phi(X(k), Y(k))) - Q(k-1) \sin(\Delta\phi(X(k), Y(k)))$$

$$Q(k) = I(k-1) \sin(\Delta\phi(X(k), Y(k))) + Q(k-1) \cos(\Delta\phi(X(k), Y(k)))$$

where k is an index of the bit pairs; k=1 for bits one and two paired, k=2 for bits three and four paired, etc. I(k−1) and Q(k−1) are the amplitudes of the cosine and sine components of the previous symbol vector. X(k) represents the first bit of bit pair (k) and Y(k) represents the second bit of bit pair (k). The phase change, $\Delta\phi$, is determined according to the following table:

| X(k) | Y(k) | $\Delta\phi(X(k),Y(k))$ |
|------|------|-------------------------|
| 1    | 1    | $-3\pi/4$               |
| 0    | 1    | $3\pi/4$                |
| 0    | 0    | $\pi/4$                 |
| 1    | 0    | $-\pi/4$                |

Thus, one of four possible symbols are transmitted for each two bits of the serial data stream.

The reason for the modulation nomenclature $\pi/4$-shift DQPSK and how it works is now evident: the phase shift is in $\pi/4$ increments in vector space, symbols are differentially encoded with respect to the previous symbol vector, and the information bearing quantity in IF signal 102 is the phase-shift with one of four possible shifts between any two symbols. The operation of modulator 602 is represented by the equation:

$$V_{out}(t) = (I(t)) \cos(2\pi ft) + (Q(t)) \sin(2\pi ft)$$

where $V_{out}(t)$ is the modulated IF signal 102 and I(t) and Q(t) are I(k) and Q(k) as defined above as a function of time, and f is the transmit IF of 90 MHz.

In the preferred embodiment of telephone 600 in FIG. 1, quadrature demodulator 624 may be implemented as described in the instant assignee's copending patent application Ser. No. 07/590,401, entitled "A Carrier Recovery Method and Apparatus Having an Adjustable Response Time Determined by Carrier Signal Parameters", invented by Stephen V. Cahill, and filed Sep. 28, 1990 (incorporated herein by reference). Quadrature demodulator 624 demodulates TDMA RF signals modulated with information according to $\pi/4$-shift DQPSK and generates the receive I and Q signals. The receive I and Q signals are deformated and decoded by data deformat circuitry 625 to recover the digitized voice signals, which are applied to vocoder 612.

In the preferred embodiment of telephone 600 in FIG. 1, vocoder 612 is implemented as described in the instant assignee's U.S. Pat. Nos. 4,817,157 and 4,896,361 (incorporated herein by reference). Vocoder 612 encodes and decodes voice signals according to code excited linear prediction (CELP) coding. Filters 618 and 622 are intercoupled as a duplexer for transmitting TDMA RF signals on, and receiving TDMA RF signals from antenna 620. Filters 618 and 622 may be any suitable conventional filters, such as, for example, the filters described in U.S. Pat. Nos. 4,431,977, 4,692,726, 4,716,391, and 4,742,562 (incorporated herein by reference). Vocoder 612, data format circuitry 601, data deformat circuitry 625, quadrature modulator 602, and quadrature demodulator 624 may be implemented with commercially available digital signal processors, such as, for example, the Motorola type DSP 56000 digital signal processor.

According to the present invention, power control circuitry of transmitter 604 in FIG. 1 is preferably implemented as illustrated in FIG. 2. Although utilized in telephones 600, the power control circuitry of the present invention may also be utilized in dual-mode TDMA/FDMA cellular telephones, conventional frequency division multiple access cellular telephones, in code division multiple access cellular telephones, and in other analog and digital cellular telephones employing different transmission schemes. Referring now to FIG. 2, the power control circuitry includes variable gain stage 104, mixer 106, bandpass filter 109, RF amplifier 110, and directional coupler 112 in a forward path, and detectors 116 and 117, analog-to digital (A/D) converters 118, 119, 121 and 123, digital controller 120 and digital-to analog (D/A) converter 126 in a feedback path. Transmit IF signal 102 from quadrature modulator 602 has a frequency of 90 MHz and is modulated with DQPSK information.

Stage 104 in FIG. 2 has a variable gain for adjusting the magnitude of IF signal 102 in response to a gain control signal, D/A converter output signal 128. Stage 104 may be implemented by means of a variable gain amplifier or a variable gain attenuator, where the gain is adjusted substantially in proportion to the value of gain control signal 128. In the preferred embodiment, stage 104 is a variable gain amplifier similar to the Motorola type MC1350 IF amplifier. The adjusted IF signal from stage 104 is mixed with the RF reference signal 108 from synthesizer 616 to produce the RF transmit signal. The RF transmit signal is filtered by bandpass filter 109 and amplified by RF amplifier 110, and passed through directional coupler 112 to produce the RF transmit output signal 114. The transmit output signal 114 is coupled from directional coupler 112 to transmit filter 618 and thereafter antenna 620 for transmission.

Figure 3:
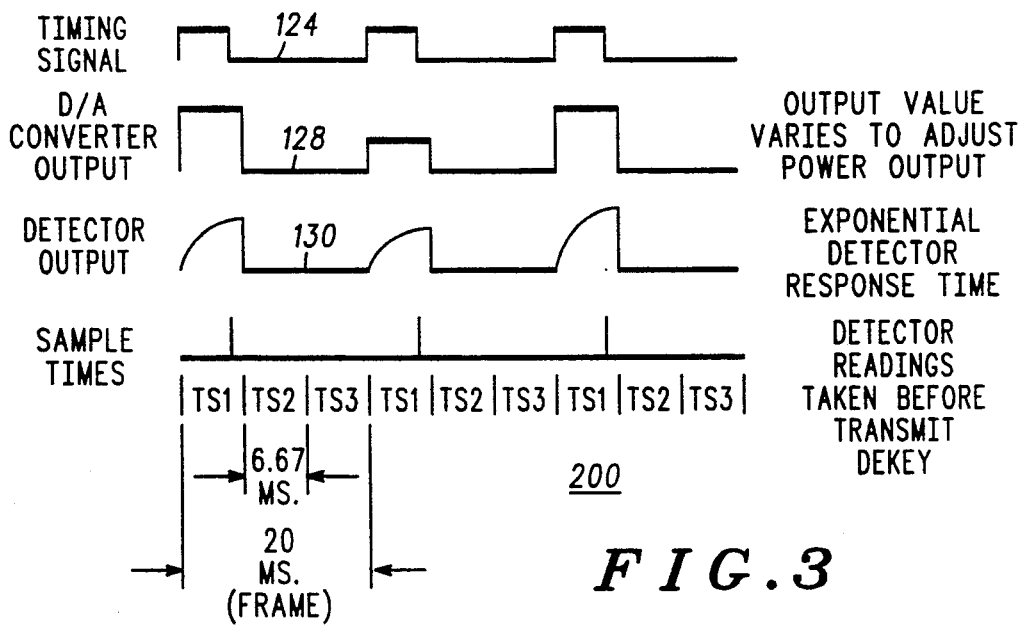
FIG. 3 is a timing diagram for the power control circuitry in FIG. 2.

The operation of the power control circuitry in FIG. 2 is further illustrated by the timing diagram in FIG. 3. Timing signal 124 has a waveform defining a series of transmit time intervals, which in FIG. 3 correspond to time slot TS1 of three possible time slots TS1, TS2, and TS3 for a TDMA RF channel. The TDMA RF channel consists of multiple frames of 20 milliseconds each containing three time slots TS1, TS2, and TS3 of approximately 6.67 milliseconds each. During a cellular telephone call in a TDMA cellular system, TDMA cellular cellular telephone 600 is assigned to a TDMA RF channel and a time slot of that channel for transmission of the modulated transmit output signal 114 carrying voice signals, signalling information and overhead information. Accordingly, it is necessary that the transmit output signal 114 be transmitted, over varying A+ supply voltage, temperature and antenna loading, at the desired power level selected by the power level signals 122 during each of the assigned time slots.

In the power control circuitry in FIG. 2, D/A converter 126 is loaded by controller 120 at the beginning of each assigned time slot with the value stored in its memory and at the end of each assigned time slot with a zero value for essentially turning the transmit output signal 114 on and off. In addition, amplifier 110 may also be turned on and off by gating its bias on and off by way of bias control signal 136. The D/A converter output 128 in FIG. 2 has a value which varies from time slot to time slot to maintain the output power of transmit output signal 114 at the desired power level. The waveform of detector output 130 in FIG. 2 has an exponential response due to the relatively long time constant of detector 116 with respect to the time slot length. Due to the relatively long time constant of detector 116, the output of detector 116 near the end of the time slot has a value related to the average magnitude of the transmit output signal 114. Detectors 116 and 117, as shown in FIG. 4, include rectifying circuitry comprised of diode 502 and capacitor 504, and averaging circuitry comprised of capacitors 504 and 508 and resistor 506. In the preferred embodiment, averaging circuitry 504, 506 and 508 has a time constant of approximately one millisecond.

Near the end of each time slot as illustrated by the sample times in FIG. 3, the value of the detector output 130 is sampled via A/D converter 118 and used by controller 120 to compute a new value of D/A converter output 128 by subtracting the sampled value (DETECT in FIGS. 8 and 9) of the detector output 130 from the desired value for the selected power level, scaling the difference by a pre-selected factor, and summing the scaled difference with the previous value stored in memory. The new value of D/A converter output 128 is stored by controller 120 in its memory and loaded into D/A converter 126 at the beginning of the next assigned time slot.

According to a feature of the present invention, the magnitude of the A+supply voltage and the magnitude of the temperature of the power control circuitry as reflected by the magnitude of thermistor 127 (located in the same housing as RF amplifier 110) are sampled by A/D converters 123 and 119, respectively, and used by controller 120 together with the magnitude of the forward power as sampled by A/D converter 118 for accurately and reliably maintaining the output power of the transmit output signal 114 at the desired one of the possible eight power levels. In the preferred embodiment, the desired power level must be maintained within +2 to −4 dB of the nominal power for that power level (see the aforementioned Interim Standard 54). Since RF amplifier 110 is preferably a linear power amplifier for TDMA operation of telephone 600, it is susceptible to three undesirable operating conditions: (1) saturation due to low A+supply voltage or high temperature; (2) low or high initial output power levels due to temperature induced gain changes; or (3) excessive reflected power due to a damaged, missing, or obstructed antenna. Operating RF amplifier under such undesirable conditions may result in poor linearity causing interference with other cellular radio channels. By utilizing the present invention, the output power of transmit output signal 114 is maintained at the desired power level by monitoring not only the magnitude of the forward power, but also the magnitude of A+supply voltage and temperature of the power control circuitry, and appropriately adjusting the D/A converter output 128 in response to the changes detected in same. Moreover, if the A+supply voltage exceeds a predetermined maximum voltage VMAX, or if the reverse power is outside its normal range, the RF amplifier 110 is dekeyed (i.e. shut off by gating off its bias by way of bias control signal 136) to protect it from damage.

Figure 6:
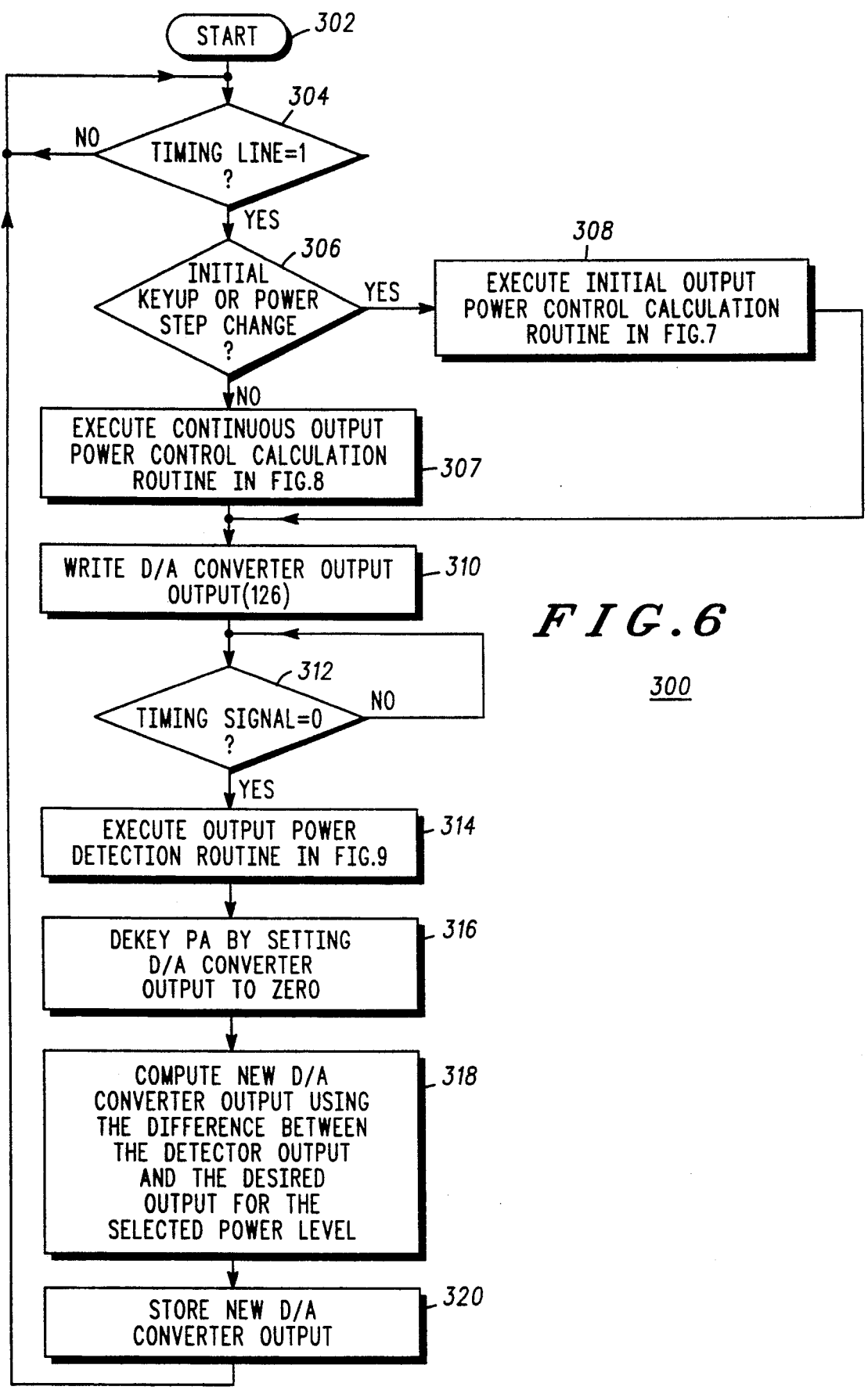
FIG. 6 is a flow chart for the process used by controller 120 in FIG. 2.
Figure 7:
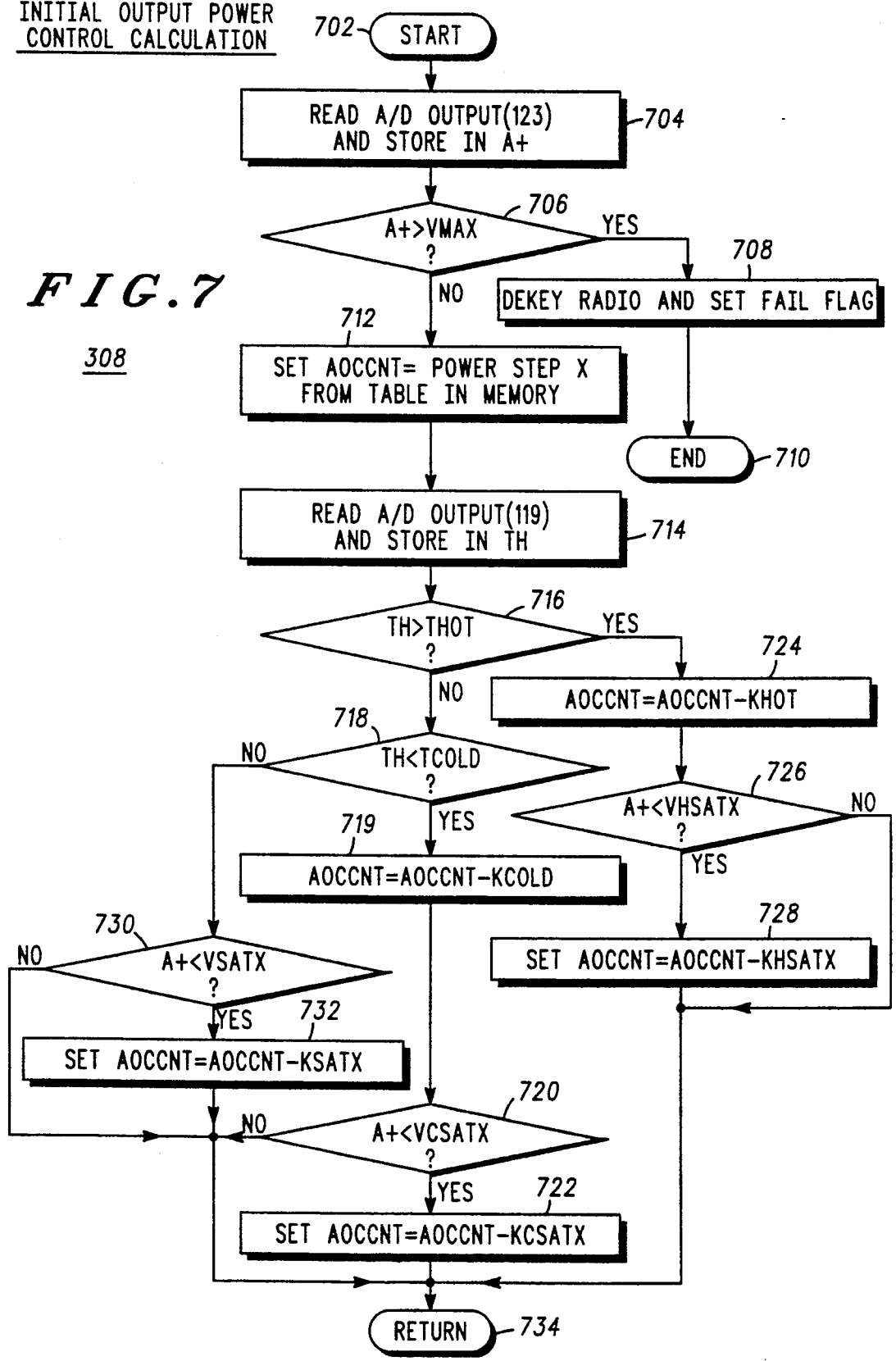
FIG. 7 is a flow chart for the initial output power control calculation routine 308 used by controller 120 in FIG. 2.
Figure 8:
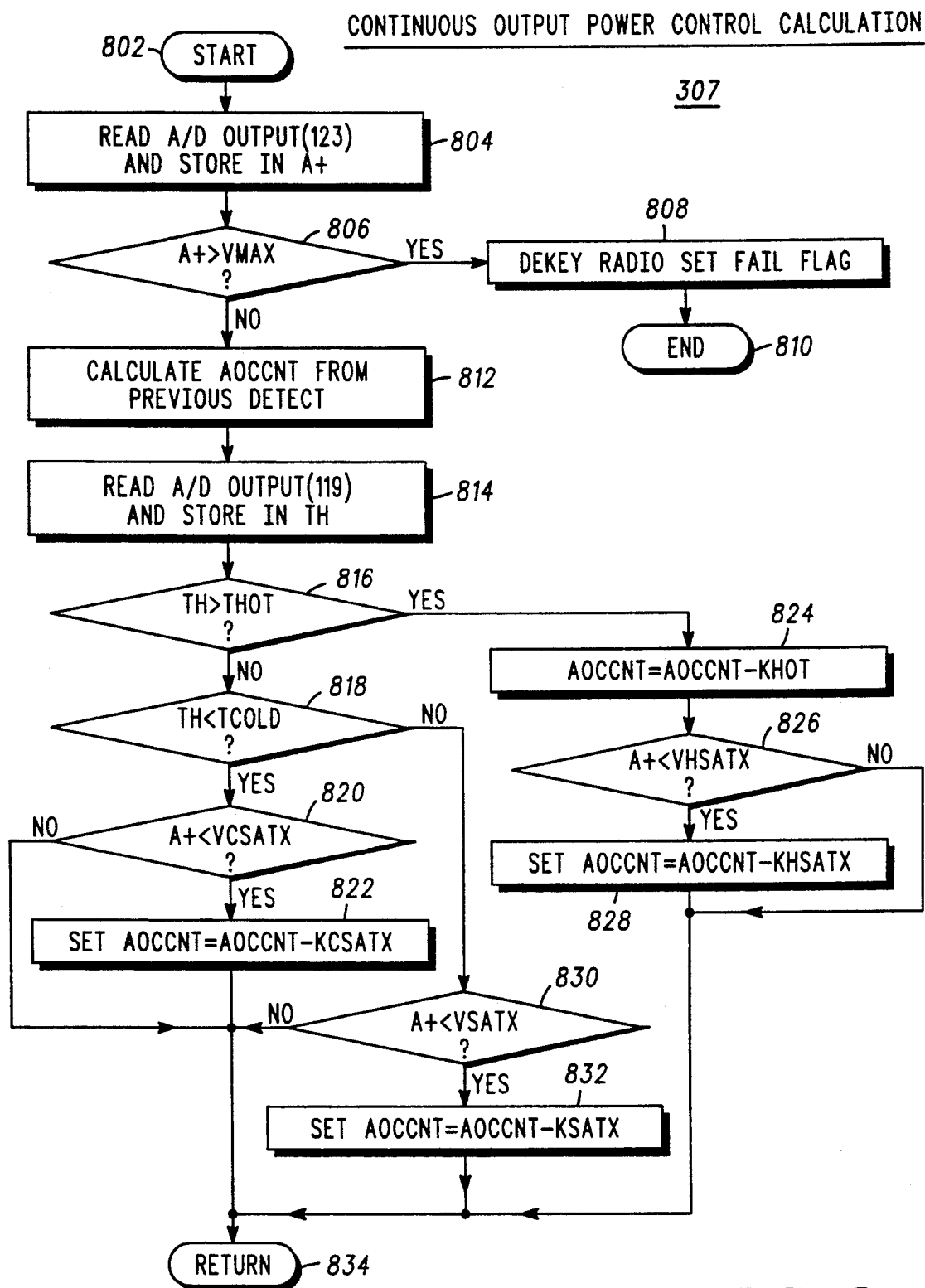
FIG. 8 is a flow chart for the continuous output power control calculation routine 307 used by controller 120 in FIG. 2.

Referring next to FIG. 6, there is illustrated a flow chart for the process used by controller 120 for maintaining the output power of the transmit output signal 114 at the desired power level. At the beginning of the current transmission, the bias of RF amplifier 110 is gated on by way of bias control signal 136. Entering at START block 302, the process proceeds to decision block 304, where a check of timing signal 124 is made to determine if timing signal 124 has a binary one state. If not, NO branch is taken to wait. If timing signal 124 has a binary one state, YES branch is taken from decision block 304 to block 306, where a check of is made to determine if transmitter 604 is initially being keyed up (i.e., turned on) or if a power step change must be made. If so, YES branch is taken to block 308 where the initial output power control calculation routine in FIG. 7 is executed. If transmitter 604 is not being initially keyed up or a power step change need not be made, NO branch is taken from decision block 306 to block 307 where the continuous output power control calculation routine in FIG. 8 is executed. Execution of the routines in FIGS. 7 or 8 determines the value for D/A converter output 128. Next, at block 310, the determined value AOCCNT for D/A converter output signal 128 is applied to D/A converter 126 for keying up RF amplifier 110. D/A converter 126 in turn converts the applied value AOCCNT to an analog gain control voltage, which is applied to variable gain stage 104 for adjusting the amount of gain.

Figure 9:
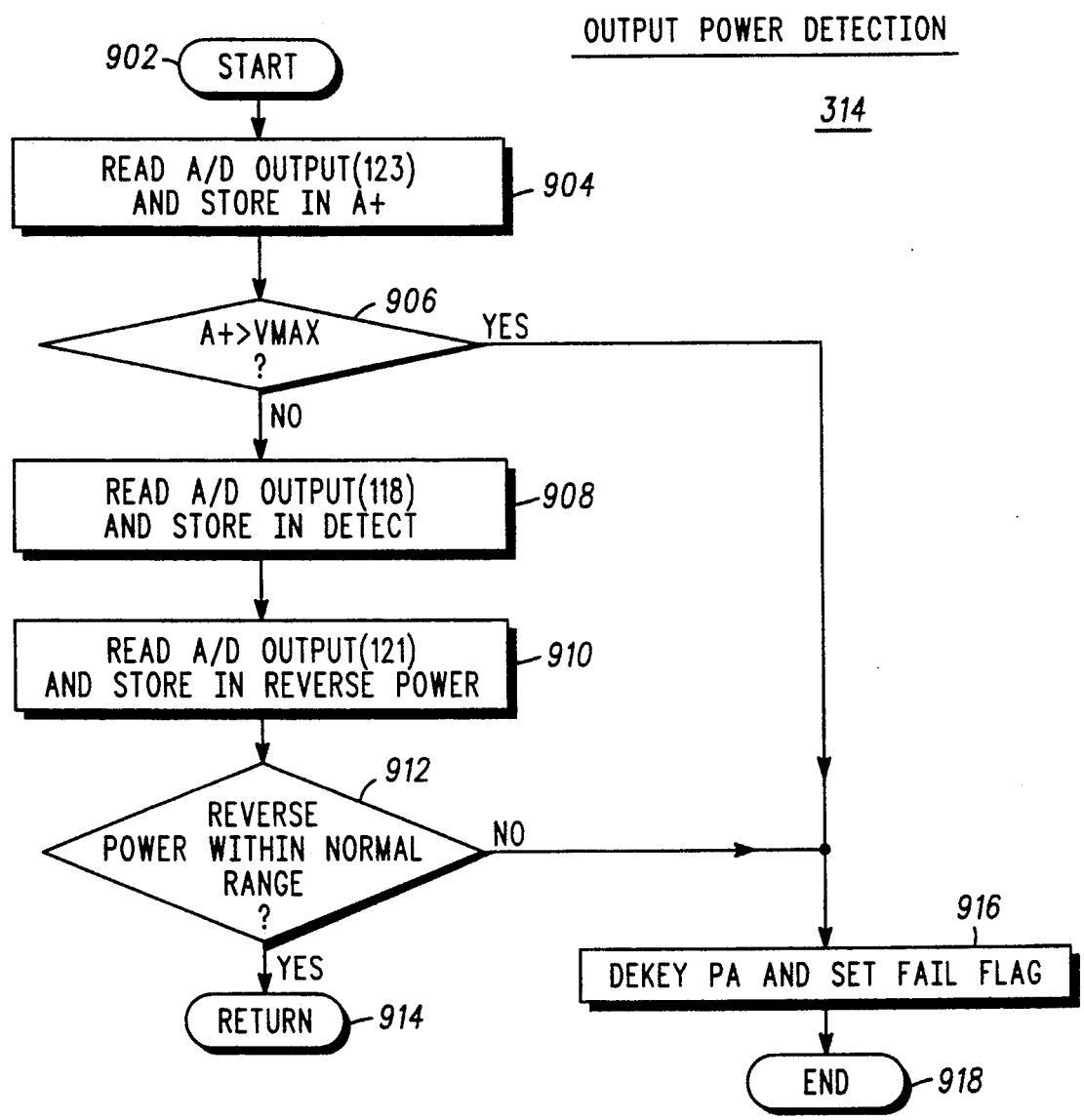
FIG. 9 is a flow chart for the output power detection routine 314 used by controller 120 in FIG. 2.

Next, at decision block 312 in FIG. 6, a check of timing signal 124 is made again to determine if the timing signal 124 has a binary zero state. If not, NO branch is taken to wait. If timing signal 124 has a binary zero state, YES branch is taken from decision block 312 to block 314, where the output power detection routine in FIG. 9 is executed. Execution of the routines in FIG. 9 determines the value for the forward power DETECT and the value for the reverse power REVERSE POWER. Next, at block 316, transmitter 604 is dekeyed (i.e., shut off) by setting D/A converter output 128 to zero. Then, at block 318, a new value of D/A converter output 128 is calculated by subtracting the sampled value of the detector output 130 from the desired value for the selected power level, scaling the difference by a pre-selected factor, and summing the scaled difference with the previous value of D/A converter output 128 stored in memory. Then, the new value of D/A converter output 128 is stored in the memory of controller 120 at block 320 for use during the next assigned time slot, and control returns to decision block 304 to repeat the foregoing process for the next assigned time slot. At the end of the current transmission, the bias of RF amplifier 110 is gated off by way of bias control signal 136.

Referring next to FIG. 7, there is illustrated a flow chart for the initial output power control calculation routine 308 in FIG. 6 used by controller 120 in FIG. 2. Entering at START block 702, the process proceeds to block 704 where the output of A/D converter 123 is read and stored in the location labelled A+. Next, at decision block 706, a check is made to determine if the value of A+ is greater than VMAX, which is a predetermined A/D converter output value corresponding to the maximum allowable A+ voltage. If so, YES branch is taken to block 708 to dekey RF amplifier 110 and set the FAIL FLAG to a binary one state, and thereafter program control proceeds to END block 710 to terminate further operation of RF amplifier 110. If A+ is not greater than VMAX, NO branch is taken from decision block 706 to block 712, where AOCCNT is set to the values for the selected power step stored in a table in the memory of controller 120. The table in the memory of controller 120 stores phased D/A converter values for each of the eight power steps. The stored values when applied to D/A converter 128 produce the desired initial magnitude of output power of the transmit output signal 114.

Next, at block 714, the value of the output of A/D converter 119 is read by controller 120 and stored in the variable TH. A/D converter 119 samples the voltage across thermistor 127, which is coupled to the A+ supply voltage by resistor 125. The magnitude of the voltage across thermistor 127 is proportional to the temperature of the power control circuitry. Next, at decision block 716, a check is made to determine if the value of TH is greater than THOT, which is a predetermined A/D converter output value corresponding to the high temperature operating range of RF amplifier 110. If so, YES branch is taken to block 724 where AOCCNT is set to its previous value minus KHOT, which is a predetermined A/D converter output value corresponding to a gain adjustment constant for high temperature operation of RF amplifier 110. Although AOCCNT is adjusted in blocks 719, 722, 724, 728 and 732 of FIG. 7 and in blocks 822, 824, 828 and 832 of FIG. 8, in other embodiments, the selected power level PLEVEL may be temporarily adjusted instead of AOCCNT, provided that the initial values of the eight power levels are not changed. Next, at decision block 726, a check is made to determine if the value of A+ is less than VHSATX, which is a predetermined A/D converter output value corresponding to the A+ supply voltage at which RF amplifier 110 enters saturation at high temperature operation and the selected power step. If not, NO branch is taken to RETURN block 734 to return to the flow chart of FIG. 6. If A+ is less than VHSATX, YES branch is taken from decision block 726 to block 728, where AOCCNT is set to its previous value minus KHSATX, which is a predetermined A/D converter output value corresponding to a voltage margin that will prevent saturation of RF amplifier 110 at high temperature operation. Thereafter, program control returns to FIG. 6 at RETURN block 734.

Returning to decision block 716 in FIG. 7, if TH is not greater than THOT, NO branch is taken to decision block 718, where a check is made to determine if the value of TH is less than TCOLD, which is a predetermined A/D converter output value corresponding to the low temperature operating range of RF amplifier 110. If so, YES branch is taken to block 719 where AOCCNT is set to its previous value minus KCOLD, which is a predetermined A/D converter output value corresponding to a gain adjustment constant for low temperature operation of RF amplifier 110. Next, at decision block 720, a check is made to determine if the value of A+ is less than VCSATX, which is a predetermined A/D converter output value corresponding to the A+ supply voltage at which RF amplifier 110 enters saturation at low temperature operation and the selected power step. If not, NO branch is taken to RETURN block 734 to return to the flow chart of FIG. 6. If A+ is less than VCSATX, YES branch is taken from decision block 720 to block 722, where AOCCNT is set to its previous value minus KCSATX, which is a predetermined A/D converter output value corresponding to a voltage margin that will prevent saturation of RF amplifier 110 at low temperature operation. Thereafter, program control returns to FIG. 6 at RETURN block 734. Returning to decision block 718, if TH is not less than TCOLD, NO branch is taken to decision block 730, where a check is made to determine if the value of A+ is less than VSATX, which is a predetermined A/D converter output value corresponding to the A+ supply voltage at which RF amplifier 110 enters saturation at normal temperature operation and the selected power step. If not, NO branch is taken to RETURN block 734 to return to the flow chart of FIG. 6. If A+ is less than VSATX, YES branch is taken from decision block 730 to block 732, where AOCCNT is set to its previous value minus KSATX, which is a predetermined A/D converter output value corresponding to a voltage margin that will prevent saturation of RF amplifier 110 at normal temperature operation. Thereafter, program control returns to FIG. 6 at RETURN block 734.

Referring next to FIG. 8, there is illustrated a flow chart for the continuous output power control calculation routine 307 in FIG. 6 used by controller 120 in FIG. 2. Entering at START block 802, the process proceeds to block 804 where the output of A/D converter 123 is read and stored in the location labelled A+. Next, at decision block 806, a check is made to determine if the value of A+ is greater than VMAX, which is a predetermined A/D converter output value corresponding to the maximum allowable A+ voltage. If so, YES branch is taken to block 808 to dekey RF amplifier 110 and set the FAIL FLAG to a binary one state, and thereafter program control proceeds to END block 810 to terminate further operation of RF amplifier 110. If A+ is not greater than VMAX, NO branch is taken from decision block 806 to block 812, where AOCCNT is calculated from its previous value and the value of DETECT stored in the memory of controller 120. In the preferred embodiment, the new value of AOCCNT is calculated by subtracting the value of DETECT from the desired value for the selected power level PLEVEL, scaling the difference by a preselected factor KDET, and summing the scaled difference with the previous value of AOCCNT. This calculation is expressed in the following equation.

AOCCNT=AOCCNT+KDET(PLEVEL—DETECT).

Next, at decision block 814 in FIG. 8, the value of the output of A/D converter 119 is read by controller 120 and stored in the variable TH. Then, at decision block 816, a check is made to determine if the value of TH is greater than THOT. If so, YES branch is taken to block 824 where AOCCNT is set to its previous value minus KHOT. Next, at decision block 826, a check is made to determine if the value of A+ is less than VHSATX. If not, NO branch is taken to RETURN block 834 to return to the flow chart of FIG. 6. If A+ is less than VHSATX, YES branch is taken from decision block 826 to block 828, where AOCCNT is set to its previous value minus KHSATX. Thereafter, program control returns to FIG. 6 at RETURN block 834.

Returning to decision block 816 in FIG. 8, if TH is not greater than THOT, NO branch is taken to decision block 818, where a check is made to determine if the value of TH is less than TCOLD. If so, YES branch is taken to block 819 where AOCCNT is set to its previous value minus KCOLD. Next, at decision block 820, a check is made to determine if the value of A+ is less than VCSATX. If not, NO branch is taken to RETURN block 834 to return to the flow chart of FIG. 6. If A+ is less than VCSATX, YES branch is taken from decision block 820 to block 822, where AOCCNT is set to its previous value minus KCSATX. Thereafter, program control returns to FIG. 6 at RETURN block 834. Returning to decision block 818, if TH is not less than TCOLD, NO branch is taken to decision block 830, where a check is made to determine if the value A+ is less than VSATX. If not, NO branch is taken to RETURN block 834 to return to the flow chart of FIG. 6. If A+ is less than VSATX, YES branch is taken from decision block 830 to block 832, where AOCCNT is set to its previous value minus KSATX. Thereafter, program control returns to FIG. 6 at RETURN block 834.

Referring next to FIG. 9, there is illustrated a flow chart for the output power detection routine 314 in FIG. 6 used by controller 120 in FIG. 2. Entering at START block 902, the process proceeds to block 904 where the output of A/D converter 123 is read and stored in the location labelled A+. Next, at decision block 906, a check is made to determine if the value of A+ is greater than VMAX, which is a predetermined A/D converter output value corresponding to the maximum allowable A+ voltage. If so, YES branch is taken to block 916 to dekey RF amplifier 110 and set the FAIL FLAG to a binary one state, and thereafter program control proceeds to END block 918 to terminate further operation of RF amplifier 110.

Returning to decision block 906 in FIG. 9, if A+ is not greater than VMAX, NO branch is taken to block 908, where the output of A/D converter 118 is read and stored in the location labelled DETECT. Next, at block 910, the output of A/D converter 121 is read and stored in the location labelled REVERSE POWER. Then, at decision block 906, a check is made to determine if the value of REVERSE POWER is within the NORMAL RANGE, that is at least 10 dB less than the selected power level PLEVEL. If not, NO branch is taken to block 916 to dekey RF amplifier 110 and set the FAIL FLAG to a binary one state, and thereafter program control proceeds to END block 918 to terminate further operation of RF amplifier 110. IF REVERSE POWER is within the NORMAL RANGE, YES branch is taken from decision block 912 to to RETURN block 914 to return to the flow chart of FIG. 6.

For the flow charts of FIGS. 6, 7, 8 and 9, exemplary values of the variables used therein are set out below. These exemplary values are converted to A/D converter values and stored in the memory of controller 120.

PLEVEL=7 dBm, 11 dBm, 15 dBm, 19 dBm, 23 dBm, 27 dBm, 31 dBm, or 35 dBm
TH=−30 to +60 Degrees Centigrade
A+=10.8 to 16.0 Volts
TCOLD=0 Degrees Centigrade
THOT=+40 Degrees Centigrade
KHOT=20 Millivolts
KCOLD=20 Millivolts
VMAX=15.0 Volts
VCSATX=13.0 Volts
VHSATX=11.0 Volts
VSATX=12.0 Volts
KCSATX=20 Millivolts
KHSATX=20 Millivolts
KSATX=20 Millivolts
NORMAL RANGE=At least 10 dB less than PLEVEL.

In summary, unique output power control circuitry precisely maintains initially and dynamically the output power of transmit output signal at a desired power level selected by power level signals during a series of transmit time intervals, such as, for example, the assigned time slots of a TDMA RF channel. In operation, a variable gain stage is responsive to a gain control signal for adjusting a modulated IF signal, which is then mixed with an RF reference signal to produce the transmit RF signal. The temperature and supply voltage are sampled at the beginning of each time slot. Adjustments in the gain control signal dictated by the sampled temperature and supply voltage are made in each time slot prior to keying the RF amplifier. The transmit RF signal is amplified by an RF amplifier to produce the transmit output signal which is coupled by a directional coupler and transmit filter to an antenna for transmission. The forward power and reverse power of the transmit output signal are sampled at the end of each time slot. The sampled forward power is used in calculating the value of the gain control signal for the next time slot. If the sampled reverse power or supply voltage exceed respective maximum values, the RF amplifier is dekeyed. The novel output power control circuitry of the present invention may be advantageously utilized in TDMA cellular telephones as well as in dual-mode TDMA/FDMA cellular telephones, conventional frequency division multiple access cellular telephones, code division multiple access cellular telephones, and other analog and digital radio telephones employing different transmission schemes.

We claim:

1. Power control circuitry responsive to a transmit signal, level control signals, a timing signal defining a series of transmit time intervals, and a supply voltage from a signal source for maintaining during the transmit time intervals the average magnitude of a radio frequency (RF) output signal at a power level selected from a plurality of power levels by the level control signals, said supply voltage having a magnitude between a predetermined minimum voltage and a predetermined maximum voltage, said power control circuitry comprising:

a memory for storing the value of a gain control signal;

adjusting circuitry having variable gain for adjusting the transmit signal during the transmit time intervals substantially in proportion to the stored value of the gain control signal to produce an adjusted transmit signal, said adjusting circuitry substantially blocking the transmit signal at times other than those during the transmit time intervals;

an amplifier coupled to the supply voltage for amplifying the adjusted transmit signal to produce the RF output signal;

an antenna coupled to the amplifier for transmitting the RF output signal;

a voltage detector for detecting the magnitude of the supply voltage;

a temperature detector for detecting the temperature of the power control circuitry;

a first power detector coupled to the RF output signal for generating a first output signal having a value related to the magnitude of the forward power of the RF output signal; and control circuitry coupled to the first power detector for sampling the value of the first output signal substantially at the end of each transmit time interval, adjusting the value of the gain control signal in response to the difference between the sampled value of the first output signal and the selected power level, and storing the adjusted value of the gain control signal in the memory, said control circuitry further being coupled to the temperature detector for adjusting the gain control signal by a first predetermined amount substantially at the beginning of each transmit time interval when the detected temperature is greater than a predetermined temperature, and said control circuitry further being coupled to the voltage detector for adjusting the gain control signal by a second predetermined amount substantially at the beginning of at least the initial transmit time interval when the detected magnitude of the supply voltage is less than a predetermined magnitude.

2. The power control circuitry according to claim 1, further including a second power detector coupled to the RF output signal for generating a second output signal having a value related to the magnitude of the reverse power of the RF output signal, said control circuity further being coupled to the second power detector for disabling the amplifier when the value of the second output signal exceeds a predetermined value.

3. The power control circuitry according to claim 2, further including directional coupler for coupling a portion of the reverse power of the RF output signal to the second power detector.

4. The power control circuitry according to claim 1, wherein said control circuitry includes an analog to digital converter coupled to the first power detector, a digital to analog converter coupled to the adjusting circuitry, and processing circuitry coupled to said analog to digital converter and said digital to analog converter, said analog to digital converter for converting the first output signal to a digitized first output signal, said processing circuitry sampling the digitized first output signal to sample the value of the first output signal and generating a digitized gain control signal, and said digital to analog converter converting the digitized gain control signal to the gain control signal.

5. The power control circuitry according to claim 1, further including a directional coupler for coupling a portion of the forward power of the RF output signal to the first power detector.

6. The power control circuitry according to claim 1, wherein said first power detector comprises a diode detector.

7. The power control circuitry according to claim 1, further including filtering circuitry intercoupling said antenna and said amplifier.

8. A radio communicating via a plurality of radio channels, said radio comprising in combination:

an antenna for receiving and transmitting signals via the plurality of radio channels;

a receiver coupled to the antenna for receiving a receive signal via one of the plurality of radio channels;

a transmitter coupled to the antenna for transmitting a radio frequency (RF) output via one of the plurality of radio channels, said transmitter further including power control circuitry responsive to a transmit signal, level control signals, a timing signal defining a series of transmit time intervals, and a supply voltage from a signal source for maintaining during the transmit time intervals the average magnitude of the RF output signal at a power level selected from a plurality of power levels by the level control signals, said supply voltage having a magnitude between a predetermined minimum voltage and a predetermined maximum voltage, said power control circuitry further comprising:

a memory for storing the value of a gain control signal;

adjusting circuitry having variable gain for adjusting the transmit signal during the transmit time intervals substantially in proportion to the stored value of the gain control signal to produce an adjusted transmit signal, said adjusting circuitry substantially blocking the transmit signal at times other than those during the transmit time intervals;

an amplifier coupled to the supply voltage for amplifying the adjusted transmit signal to produce the RF output signal;

a voltage detector for detecting the magnitude of the supply voltage;

a temperature detector for detecting the temperature of the power control circuitry;

a power detector coupled to the RF output signal for generating an output signal having a value related to the magnitude of the forward power of the RF output signal; and control circuitry coupled to the power detector for sampling the value of the output signal substantially at the end of each transmit time interval, adjusting the value of the gain control signal in response to the difference between the sampled value of the output signal and the selected power level, and storing the adjusted value of the gain control signal in the memory, said control further being coupled to the temperature detector for adjusting the gain control signal by a first predetermined amount substantially at the beginning of each transmit time interval when the detected temperature is greater than a predetermined temperature, and said control circuitry further being coupled to the voltage detector for adjusting the gain control signal by a second predetermined amount substantially at the beginning of at least the first one of the series of transmit time intervals when the detected magnitude of the supply voltage is less than a predetermined magnitude.

9. Power control circuitry responsive to a transmit intermediate frequency (IF) signal, level control signals, a timing signal defining a series of transmit time intervals, and a supply voltage from a signal source for maintaining during the transmit time intervals the average magnitude of a radio frequency (RF) output signal at a power level selected from a plurality of power levels by the level control signals, said supply voltage having a magnitude between a predetermined minimum voltage and a predetermined maximum voltage, said power control circuitry comprising:

reference circuitry for generating an RF reference signal;

a memory for storing the value of a gain control signal;

adjusting circuitry having variable gain for adjusting the transmit IF signal during the transmit time intervals substantially in proportion to the stored value of the gain control signal to produce an adjusted transmit IF signal, said adjusting circuitry substantially blocking the transmit IF signal at times other than those during the transmit time intervals;

a mixer for combining the adjusted transmit IF signal and the RF reference signal to produce an RF transmit signal;

an amplifier coupled to the supply voltage for amplifying the RF transmit signal to produce the RF output signal;

an antenna coupled to the amplifier for transmitting the RF output signal;

a voltage detector for detecting the magnitude of the supply voltage;

a temperature detector for detecting the temperature of the power control circuitry;

a first power detector coupled to the RF output signal for generating a first output signal having a value related to the magnitude of the forward power of the RF output signal; and control circuitry coupled to the first power detector for sampling the value of the first output signal substantially at the end of each transmit time interval, adjusting the value of the gain control signal in response to the difference between the sampled value of the first output signal and the selected power level, and storing the adjusted value of the gain control signal in the memory, said control circuitry further being coupled to the temperature detector for adjusting the gain control signal by a first predetermined amount substantially at the beginning of each transmit time interval when the detected temperature is greater than a predetermined temperature, and said control circuitry further being coupled to the voltage detector for adjusting the gain control signal by a second predetermined amount substantially at the beginning of at least the first one of the series of transmit time intervals when the detected magnitude of the supply voltage is less than a predetermined magnitude.

10. The power control circuitry according to claim 9, further including second power detector coupled to the RF output signal for generating a second output signal having a value related to the magnitude of the reverse power of the RF output signal, said control circuitry further being coupled to the second power detector for disabling the amplifier when the value of the second output signal exceeds a predetermined value.

11. The power control circuitry according to claim 10, further including a directional coupler for coupling a portion of the reverse power of the RF output signal to the second power detector.

12. The power control circuitry according to claim 9, wherein said control circuitry includes an analog to digital converter coupled to the first power detector, a digital to analog converter coupled to the adjusting circuitry, and processing circuitry coupled to said analog to digital converter and said digital to analog converter, said analog to digital converter for converting the first output signal to a digitized first output signal, said processing circuitry sampling the digitized first output signal to sample the value of the first output signal and generating a digitized gain control signal, and said digital to analog converter converting the digitized gain control signal to the gain control signal.

13. The power control circuitry according to claim 9, further including a directional coupler for coupling a portion of the forward power of the RF output signal to the first power detector.

14. The power control circuitry according to claim 9, wherein said first power detector comprises a diode detector.

15. The power control circuitry according to claim 9, further including filtering circuitry intercoupling said antenna and said amplifier.

16. A radio communicating via a plurality of radio channels, said radio comprising in combination:
  an antenna for receiving and transmitting signals via the plurality of radio channels;
  a receiver coupled to the antenna for receiving a receive signal via one of the plurality of radio channels;
  a transmitter coupled to the antenna for transmitting a radio frequency (RF) output via one of the plurality of radio channels, said transmitting further including power control circuitry responsive to a transmit intermediate frequency (IF) signal, level control signals, a timing signal defining a series of transmit time intervals, and a supply voltage from a signal source for maintaining during the transmit time intervals the average magnitude of the RF output signal at a power level selected from a plurality of power levels by the level control signals, said supply voltage having a magnitude between a predetermined minimum voltage and a predetermined maximum voltage, said power control circuitry further comprising:
  reference circuitry for generating an RF reference signal;
  a memory for storing the value of a gain control signal;
  adjusting circuitry having variable gain for adjusting the transmit IF signal during the transmit time intervals substantially in proportion to the stored value of the gain control to produce an adjusted transmit IF signal, said adjusting circuitry substantially blocking the transmit IF signal at times other than those during the transmit time intervals;
  a mixer for combining the adjusted transmit IF signal and the RF reference signal to produce an RF transmit signal;
  an amplifier coupled to the supply voltage for amplifying the RF transmit signal to produce the RF output signal;
  a voltage detector for detecting the magnitude of the supply voltage;
  a temperature detector for detecting the temperature of the power control circuitry;
  a power detector coupled to the RF output signal for generating an output signal having a value related to the magnitude of the forward power of the RF output signal; and
  control circuitry coupled to the power detector for sampling the value of the output signal substantially at the end of each transmit time interval, adjusting the value of the gain control signal in response to the difference between the sampled value of the output signal and the selected power level, and storing the adjusted value of the gain control signal in the memory said control circuitry further being coupled to the temperature detector for adjusting the gain control signal by a first predetermined amount substantially at the beginning of each transmit time interval when the detected temperature is greater than a predetermined temperature, and said control circuitry further being coupled to the voltage detector for adjusting the gain control signal by a second predetermined amount substantially at the beginning of at least the first one of the series of transmit time intervals when the detected magnitude of the supply voltage is less than a predetermined magnitude.

17. Power control circuitry responsive to a transmit signal, level control signals, and a supply voltage from a signal source for maintaining the magnitude of a radio frequency (RF) output signal at a power level selected from a plurality of power levels by the level control signals, said supply voltage having a magnitude between a predetermined minimum voltage and a predetermined maximum voltage, said power control circuitry comprising:
  adjusting circuitry having variable gain for adjusting the transmit signal during a series of transmit time intervals defined by a timing signal substantially in proportion to the value of the gain control signal to produce an adjusted transmit signal;
  an amplifier coupled to the supply voltage for amplifying the adjusted transmit signal to produce the RF output signal;
  an antenna coupled to the amplifier for transmitting the RF output signal;
  a voltage detector for detecting the magnitude of the supply voltage;
  a temperature detector for detecting the temperature of the power control circuitry;
  a first power detector coupled to the RF output signal for generating a first output signal having a value related to the magnitude of the forward power of the RF output signal; and
  control circuitry coupled to the first power detector for sampling the value of the first output signal substantially at a plurality of time intervals, and adjusting the value of the gain control signal in response to the difference between the sampled value of the first output signal and the selected power level, said control circuitry further being coupled to the temperature detector for adjusting the gain control signal by a first predetermined amount substantially at the beginning of each transmit time interval when the detected temperature is greater than a predetermined temperature, and said control circuitry further being coupled to the voltage detector for adjusting the gain control signal by a second predetermined amount substantially at the beginning of at least the first one of the series of transmit time intervals when the detected magnitude of the supply voltage is less than a predetermined magnitude.

18. The power control circuitry according to claim 17, further including second power detector coupled to the RF output signal for generating a second output signal having a value related to the magnitude of the reverse power of the RF output signal, said control circuitry further being coupled to the second power detector for disabling the amplifier when the value of the second output signal exceeds a predetermined value.

19. The power control circuitry according to claim 18, further including a directional coupler for coupling a portion of the reverse power of the RF output signal to the second power detector.

20. The power control circuitry according to claim 17, wherein said control circuitry includes an analog to digital converter coupled to the first power detector, a digital to analog converter coupled to the adjusting circuitry, and processing circuitry coupled to said analog to digital converter and said digital to analog converter, said analog to digital converter for converting the first output signal to a digitized first output signal, said processing circuitry sampling the digitized first output signal to sample the value of the first output signal and generating a digitized gain control signal, and said digital to analog converter converting the digitized gain control signal to the gain control signal.

21. The power control circuitry according to claim 17, further including a directional coupler for coupling a portion of the forward power of the RF output signal to the first power detector.

22. The power control circuitry according to claim 17, wherein said first power detector comprises a diode detector.

23. The power control circuitry according to claim 17, further including filtering circuitry intercoupling said antenna and said amplifier.

24. A radio communicating via a plurality of radio channels, said radio comprising in combination:

an antenna for receiving and transmitting signals via the plurality of radio channels;

a receiver coupled to the antenna for receiving a receive signal via one of the plurality of radio channels;

a transmitter coupled to the antenna for transmitting a radio frequency (RF) output via one of the plurality of radio channels, said transmitting further including power control circuitry responsive to a transmit signal, level control signals, and a supply voltage from a signal source for maintaining the magnitude of the RF output signal at a power level selected from a plurality of power levels by the level control signals, said supply voltage having a magnitude between a predetermined minimum voltage and a predetermined maximum voltage, said power control circuitry comprising:

adjusting circuitry having variable gain for adjusting the transmit signal during the a series of transmit time intervals defined by a timing signal substantially in proportion to the stored value of the gain control signal to produce an adjusted transmit signal;

an amplifier coupled to the supply voltage for amplifying the adjusted transmit signal to produce the RF output signal;

a voltage detector for detecting the magnitude of the supply voltage;

a temperature detector for detecting the temperature of the power control circuitry;

a power detector coupled to the RF output signal for generating an output signal having a value related to the magnitude of the forward power of the RF output signal; and control circuitry coupled to the power detector for sampling the value of the output signal substantially at a plurality of time intervals, and adjusting the value of the gain control signal in response to the difference between the sampled value of the output signal and the selected power level, said control circuitry further being coupled to the temperature detector for adjusting the gain control signal by a first predetermined amount substantially at the beginning of each transmit time interval when the detected temperature is greater than a predetermined temperature, and said control circuitry further being coupled to the voltage detector for adjusting the gain control signal by a second predetermined amount substantially at the beginning of at least the first one of the series of transmit time intervals when the detected magnitude of the supply voltage is less than a predetermined magnitude.

* * * * *

UNITED STATES PATENT AND TRADEMARK OFFICE
CERTIFICATE OF CORRECTION

PATENT NO.   : 5,287,555
DATED        : Feb. 15, 1994
INVENTOR(S)  : Wilson et al.

It is certified that error appears in the above-indentified patent and that said Letters Patent is hereby corrected as shown below:

On the title page: item[*]  Notice:

Please delete "Mar. 9, 2000" and insert --Dec. 20, 2010--, before "has".

Signed and Sealed this

Eighth Day of December, 1998

Attest:

BRUCE LEHMAN

Attesting Officer

Commissioner of Patents and Trademarks